US006816556B2

(12) United States Patent
Kim

(10) Patent No.: US 6,816,556 B2
(45) Date of Patent: Nov. 9, 2004

(54) BANDWIDTH-EFFICIENT CONCATENATED TRELLIS-CODED MODULATION DECODER AND DECODING METHOD THEREOF

(75) Inventor: Jin-sook Kim, Yongin (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 729 days.

(21) Appl. No.: 09/758,168

(22) Filed: Jan. 12, 2001

(65) Prior Publication Data

US 2001/0010710 A1 Aug. 2, 2001

(30) Foreign Application Priority Data

Jan. 18, 2000 (KR) .......................................... 2000-2227

(51) Int. Cl.[7] .......................... H04L 23/02; H04L 5/12; H03M 13/03
(52) U.S. Cl. ........................ 375/265; 375/340; 714/792
(58) Field of Search ............................... 375/265, 340, 375/341; 714/792, 795

(56) References Cited

U.S. PATENT DOCUMENTS

| 5,721,745 | A | * | 2/1998 | Hladik et al. ................ 714/786 |
| 5,721,746 | A | * | 2/1998 | Hladik et al. ................ 714/792 |
| 5,983,385 | A | | 11/1999 | Khayrallah et al. |
| 6,014,411 | A | * | 1/2000 | Wang .......................... 714/786 |
| 6,023,783 | A | | 2/2000 | Divsalar et al. |
| 6,192,501 | B1 | * | 2/2001 | Hladik et al. ................ 714/786 |
| 6,654,927 | B1 | * | 11/2003 | Sall et al. .................... 714/786 |
| 6,665,357 | B1 | * | 12/2003 | Somayazulu ................ 375/341 |

OTHER PUBLICATIONS

Robertson P. et al: "Bandwidth–Efficient Turbo Trellis––Coded Modulation Using Punctured Component Codes", IEEE Journal on Selected Areas in Communications, US, IEEE Inc. New York, vol. 16, No. 2, Feb. 1, 1998, pp. 206–218, XP000741775, ISSN: 0733–8716.

* cited by examiner

Primary Examiner—Betsy L. Deppe
(74) Attorney, Agent, or Firm—Burns, Doane, Swecker & Mathis, L.L.P.

(57) ABSTRACT

A bandwidth-efficient concatenated trellis-coded modulation (TCM) decoder which is realized by combining turbo codes having an advantage of coping effectively with a fading channel with TCM having an advantage of bandwidth efficiency, and a decoding method thereof are provided. A conventional TCM method has high bandwidth efficiency suitable for transmitting information at high speed. However, it is very sensitive to InterSymbol interference (ISI) so it is usually applied to a wire communication system rather than to a wireless communication system. A turbo code method is an error correction encoding method showing steadiness in a channel having severe ISI and having an excellent error correction ability, but has drawbacks of low data transmission rate and low bandwidth efficiency due to a low code rate. Bandwidth-efficient concatenated TCM is provided for enhancing the steadiness against ISI and improving power and bandwidth efficiency by applying the turbo code method to a TCM having a code rate of m/(m+1) to compensate for the drawbacks of the conventional TCM and turbo codes. A newly provided decoding method in bandwidth-efficient concatenated TCM uses a SOVA algorithm, thereby reducing decoder complexity and path memory. In addition, bandwidth-efficient concatenated TCM encoder and decoder are provided such to have parallel transition, thereby reducing the complexity of the bandwidth-efficient concatenated TCM decoder. Therefore, the Bandwidth-efficient concatenated TCM is applied to a high speed wireless communication system and can increase bandwidth efficiency and coding gain.

9 Claims, 4 Drawing Sheets

BANDWIDTH-EFFICIENT CONCATENATED TRELLIS-CODED MODULATION DECODER AND DECODING METHOD THEREOF

This application claims priority under 35 U.S.C. §§ 119 and/or 365 to 00-2227 filed in Korea on 18 Jan. 2000; the entire content of which is hereby incorporated by reference.

BACKGROUND OF THE INVENTION

1. Field of the Invention

The present invention relates to an error correction decoder and decoding method thereof for allowing information to be transmitted and received reliably in a high speed wireless communication system, and more particularly, to a bandwidth-efficient concatenated trellis-coded modulation (TCM) decoder which is realized by combining turbo codes having an advantage of coping effectively with a fading channel with TCM having an advantage of bandwidth efficiency, and decoding method thereof.

2. Description of the Related Art

As the information society has evolved recently, a higher transmission rate of information is required. Accordingly, approaches for efficiently transmitting a large amount of information using a given bandwidth have been lively studied. In addition, considering mobility significant, relevant studies have been concentrated on approaches for covering areas handled by existing wire communication with wireless communication. To meet these requirements, a high speed wireless communication system has been raised as an important matter.

A high speed wireless communication system is required to reliably transmit a possibly large amount of information at high speed using a given bandwidth. To realize such reliable high speed wireless communication, it should be possible to reliably communicate information with a small amount of redundancy added to information to be transmitted. In addition, to realize wireless communication having reliability and ensuring mobility, a communication system should be designed to cope with InterSymbol Interference (ISI) occurring in a wireless communication system.

Generally, the gain of a channel code is obtained from bandwidth expansion. In other words, the-reliability of information to be transmitted is ensured using redundancy. Although error correction ability increases in proportional to the amount of such overhead bits used, a data transmission rate decreases, thereby reducing bandwidth efficiency. In other words, a decrease in a data transmission rate or an increase in transmission power should be paid for securing the reliability. Generally, three variables, i.e., power, a bandwidth and an error probability, are in a trade-off relation so that one of them should be sacrificed in order to obtain the other factors.

To overcome this problem, a technique in which modulation referred to as TCM allowing coding gain to be obtained without expanding a bandwidth is combined with a coding technique has been introduced by Ungerboeck. The TCM mainly aims at obtaining better coding gain without an increase in a bandwidth than a case where encoding is not performed. This seems to violate the trade-off relation among power, a bandwidth and an error probability, but this may be considered effected by the trade-off relation between coding gain obtained by TCM and decoder complexity.

TCM is achieved by combining a multilevel/phase modulation signal set with a trellis coding scheme. In TCM, a signal set may be considered as a single redundancy. In other words, predetermined $2^m$ information bits of a signal set is increased to $2^{m+1}$, and then the signal set is encoded, so that coding gain is obtained but decoder complexity increases. According to TCM, information bits can be transmitted at a high transmission rate through an additional white Gaussian noise (AWGN) channel. Therefore, bandwidth efficiency can be increased. However, TCM has a disadvantage in that reliability considerably drops in a fading channel because it is very sensitive to ISI. Accordingly, TCM has been disregarded in the field of wireless communication even if it has the above advantage and has maintained its existence only in the field of MODEM of wire communication.

A turbo code method was introduced as concatenated coding and iterative decoding in the channel code field. The turbo code method announced by Berrou in 1993 is a powerful error correction coding method which realizes a low signal to noise ratio (SNR) and minimizes the probability of an error occurring due to signal distortions such as fading, ISI and AWGN. The turbo code method in which a code rate is ½, a turbo coder generating formula is G1=37 and G2=21, and the size of an interleaver is 256×256 has excellent error correction performance such that Eb/N0 for a bit error probability Pe=$10^{-5}$ when the number of iterations of decoding is 18 in an AWGN channel is 0.7 dB. Due to the excellent error correction ability and steadiness against fading and interference, turbo codes recently tend to be used as channel codes in the field of wire and wireless communication.

However, the turbo codes usually have a code rate of at most ½ due to their structure. In other words, overhead bits as many as or more than information bits to be transmitted should be transmitted together with the information bits, so that a data transmission rate decreases, and bandwidth efficiency is low. However, the turbo codes have a steady characteristic to a fading channel so that fading can be overcome in a high speed wireless communication channel by using turbo codes having excellent error correction performance.

SUMMARY OF THE INVENTION

To solve the above problems, it is an object of the present invention to provide a bandwidth-efficient concatenated trellis-coded modulation (TCM) decoder for combining turbo codes and TCM to overcome the low code rate of the turbo codes and the degradation of TCM with respect to a fading channel, and a decoding method thereof.

Accordingly, to achieve the above object of the invention, in one aspect, there is provided a bandwidth-efficient concatenated TCM encoder including a basic TCM encoding unit for receiving a predetermined m-bit data sequence, recursively generating a parity bit per data, and mapping a (m+1)-bit code word sequence including the parity bit into M-ary symbols; at least one additional TCM encoding unit for receiving the predetermined m-bit data sequence, pairwise interleaving the m-bit data sequence in a predetermined manner, recursively generating a parity bit per data of the pairwise interleaved data sequence, mapping a (m+1)-bit code word sequence including the parity bit into M-ary symbols, and pairwise de-interleaving the M-ary symbols in a manner corresponding to the predetermined manner; and a switch for puncturing the outputs of the basic TCM encoding unit and the at least one additional TCM encoding unit.

In another aspect, there is provided a bandwidth-efficient concatenated TCM decoder including a demultiplexer for distributing a predetermined number of symbols that have been encoded by a bandwidth-efficient concatenated TCM encoder and received through a channel, first through N-th TCM decoding units (N is an integer of 2 or larger) for each receiving a current priori probability and symbols distributed by the demultiplexer, generating a detection value and an extrinsic value of the detection value and multiplying the detection value by the extrinsic value to generate a new priori probability, and a data detector for detecting final data from an output of the N-th TCM decoding unit after the operation performed by the first through N-th TCM decoding units is repeated a predetermined number of times. The first through N-th TCM decoding units are connected in the form of a loop, and each of them generates a priori probability and transfers it to a next TCM decoding unit as the current priori probability.

In yet another aspect, there is provided a bandwidth-efficient concatenated TCM encoding method including the steps of (a) for receiving a predetermined m-bit data sequence, recursively generating a parity bit per data, and mapping a (m+1)-bit code word sequence including the parity bit into M-ary symbols; (b) receiving the predetermined m-bit data sequence, pairwise interleaving the m-bit data sequence in a predetermined manner, recursively generating a parity bit per data of the pairwise interleaved data sequence, mapping a (m+1)-bit code word sequence including the parity bit into M-ary symbols, and pairwise de-interleaving the M-ary symbols in a manner corresponding to the predetermined manner; and (c) puncturing and transmitting the symbols generated in the steps (a) and (b).

In still yet another aspect, there is provided a bandwidth-efficient concatenated TCM decoding method including the steps of (a) generating an initial priori probability from a predetermined number of symbols received; (b) multiplying a detection value and an extrinsic value of the detection value together which are generated using some of the predetermined number of symbols received and the initial priori probability, to generate a new priori probability; (c) setting the new priori probability as a current priori probability that has been pairwise interleaved in a predetermined manner and multiplying a detection value and an extrinsic value of the detection value together which are generated using some of the predetermined number of symbols received by the current priori probability, to generate another new priori probability; and (d) replacing the initial priori probability in the step (b) with the priori probability generated in the step (c) and repeating the steps (b) and (c) a predetermined number of times and then detecting final data.

BRIEF DESCRIPTION OF THE DRAWINGS

The above objective and advantages of the present invention will become more apparent by describing in detail preferred embodiments thereof with reference to the attached drawings in which.

DETAILED DESCRIPTION OF THE PRESENT INVENTION

Figure 1:
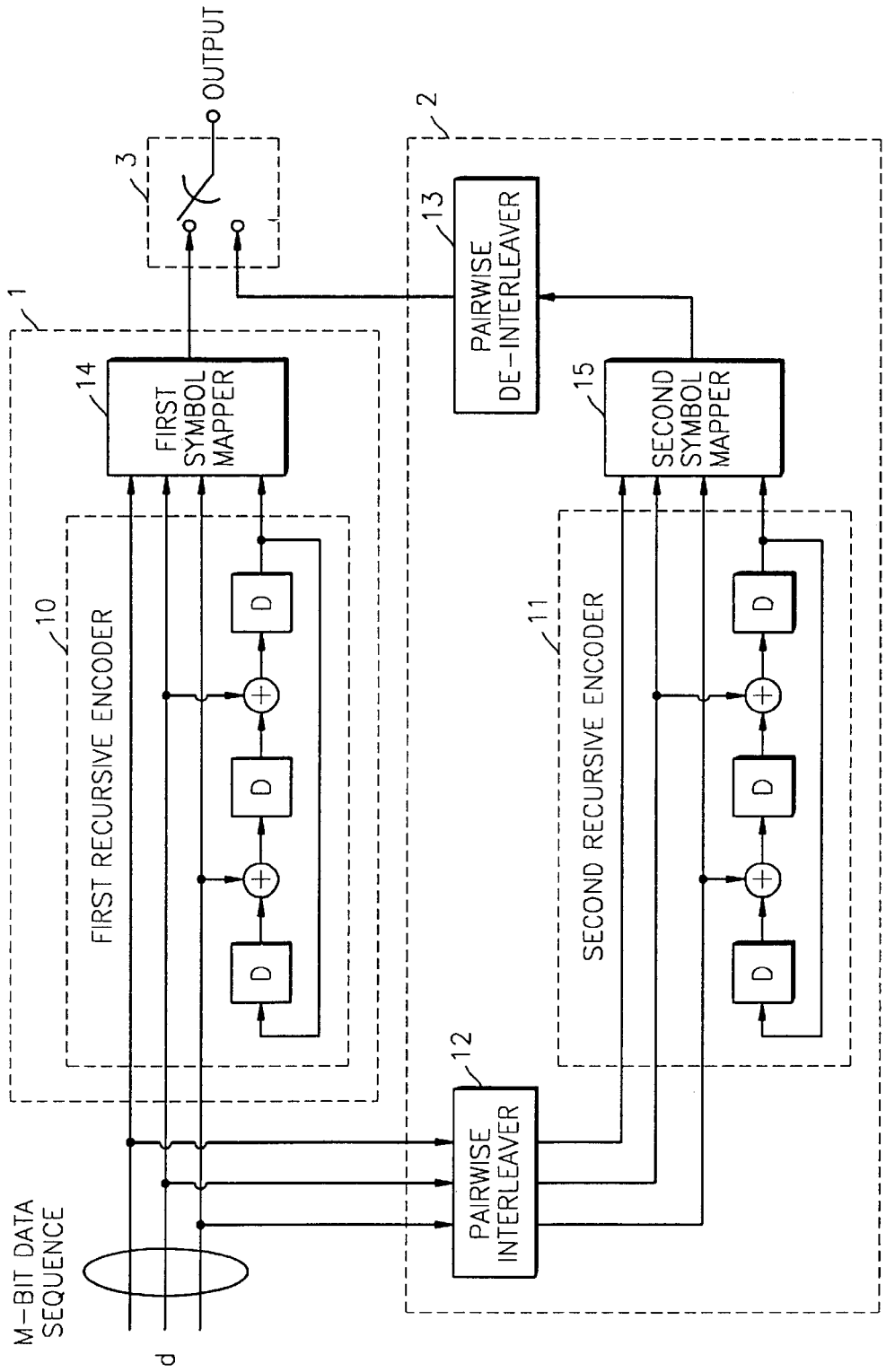
FIG. 1 is a block diagram illustrating the configuration of a bandwidth-efficient concatenated trellis-coded modulation (TCM) encoder according to an embodiment of the present invention.

Referring to FIG. 1, a bandwidth-efficient concatenated trellis-coded modulation (TCM) encoder according to an embodiment of the present invention includes a basic TCM encoding unit 1, an additional TCM encoding unit 2 and a switch 3. In this embodiment, there is only one additional TCM encoding unit 2, but the present invention covers all modifications including more than one additional TCM encoding units. In the embodiment of the present invention of FIG. 1, the basic TCM encoding unit 1 includes a first recursive encoder 10, preferably, m/(m+1) recursive systematic convolutional (RSC) codes, and a first symbol mapper 14. The additional TCM encoding unit 2 includes a pairwise interleaver 12, a second recursive encoder 11, preferably, m/(m+1) RSC codes, a second symbol mapper 15 and a pairwise de-interleaver 13.

The first recursive encoder 10 receives arbitrary m-bit data sequence and outputs a (m+1)-bit code word. The first symbol mapper 14 maps the (m+1)-bit code word to one of the M-ary symbols.

The pairwise interleaver 12 receives and interleaves the m-bit data sequence pairwise. The second recursive encoder 11 receives the output of the pairwise interleaver 12 and output a (m+1)-bit code word. The second symbol mapper 15 maps the (m+1)-bit code word to one of the M-ary symbols. The pairwise de-interleaver 13 pairwise de-interleaves the M-ary symbol. Here, each of the first and second symbol mappers 14 and 15 maps a predetermined code word to a symbol using a set partitioning method shown in FIG. 2. A reference character D within the first and second recursive encoders 10 and 11 in FIG. 1 denotes a delay unit.

The switch punctures symbols output from the basic TCM encoding unit 1 and symbols output from the additional TCM encoding unit 2 and transmits the punctured symbols to a bandwidth-efficient concatenated TCM decoder through a channel.

In the operation of a bandwidth-efficient concatenated TCM encoder according to the embodiment of the present invention, a predetermined data sequence $\underline{d}=(d_1,d_2,d_3,d_4,d_5,d_6)$ (here, $d_i=(b_1,b_2,\ldots,b_m), b\in\{0,1\}$) is input to the first recursive encoder 10 and output as $(X_1, C_1)=\{(x_{11}, c_{11}),(x_{12}, c_{12}),(x_{13}, c_{13}),(x_{14}, c_{14}),(x_{15}, c_{15}), (x_{16}, c_{16})\}$. Here, $x_{1i}=d_i(i=1,2,\ldots,6)$, and $c_{1i}$ ($i=1,2,\ldots,6$) is a parity bit generated by the first recursive encoder 10. The output $(X_1, C_1)$ of the first recursive encoder 10 is mapped to a symbol $S_1=(s_{11},s_{12},s_{13},s_{14},s_{15},s_{16})$ by the first symbol mapper 14.

Data sequence $\underline{d}'=(d_3,d_4,d_5,d_6,d_1,d_2)$ (here, $d_i=(b_1,b_2,\ldots,b_m), b\in\{0,1\}$) input to the second recursive encoder 11 is obtained after the data sequence $\underline{d}=(d_1,d_2,d_3,d_4,d_5,d_6)$ has been processed by the pairwise interleaver 12, so the order of data has been changed. In another embodiment including more than one addition TCM encoding units according to the present invention, pairwise interleavers included respective additional TCM encoding units changes the order of data in different manners.

The output of the second recursive encoder 11 is $(X_2, C_2)=\{(x_{23}, c_{21}), (x_{24}, c_{22}), (x_{25}, c_{23}), (x_{26}, c_{24}), (x_{21}, c_{25}), (x_{22}, c_{26})\}$. Here, $x_{2i}=d_i(i=1,2,\ldots,6)$, and $c_{2i}(i=1,2,\ldots,6)$ is a parity bit generated by the second recursive encoder 11. The output $(X_2, C_2)$ of the second recursive encoder 11 is mapped to a symbol $S_2=(s_{23},s_{24},s_{25},s_{26},s_{21},s_{22})$ by the second symbol mapper 15. The result of symbol mapping is de-interleaved by the pairwise de-interleaver 13.

To set the coding rate of the entire bandwidth-efficient concatenated TCM to m/(m+1), symbols output from the first symbol mapper 14 and symbols output from the pairwise de-interleaver 13 are punctured by the switch 3. Here, puncturing is switching in which a symbol output from the first symbol mapper 14 and a symbol output from the pairwise de-interleaver 13 are alternately output. Consequently, symbols output from the embodiment of a bandwidth-efficient concatenated TCM encoder of FIG. 1 are $s_{11}, s_{22}, s_{13}, s_{24}, s_{15}, s_{26}$.

In addition, when each of the first and second recursive encoders 10 and 11 encodes $b_1$ among $d_1=(b_1, b_2, \ldots, b_m), b \in \{0,1\}$ not to influence the generation of a parity bit, a decoder at a receiving party can decode it using parallel transition so that decoding complexity can be reduced.

Figure 2:
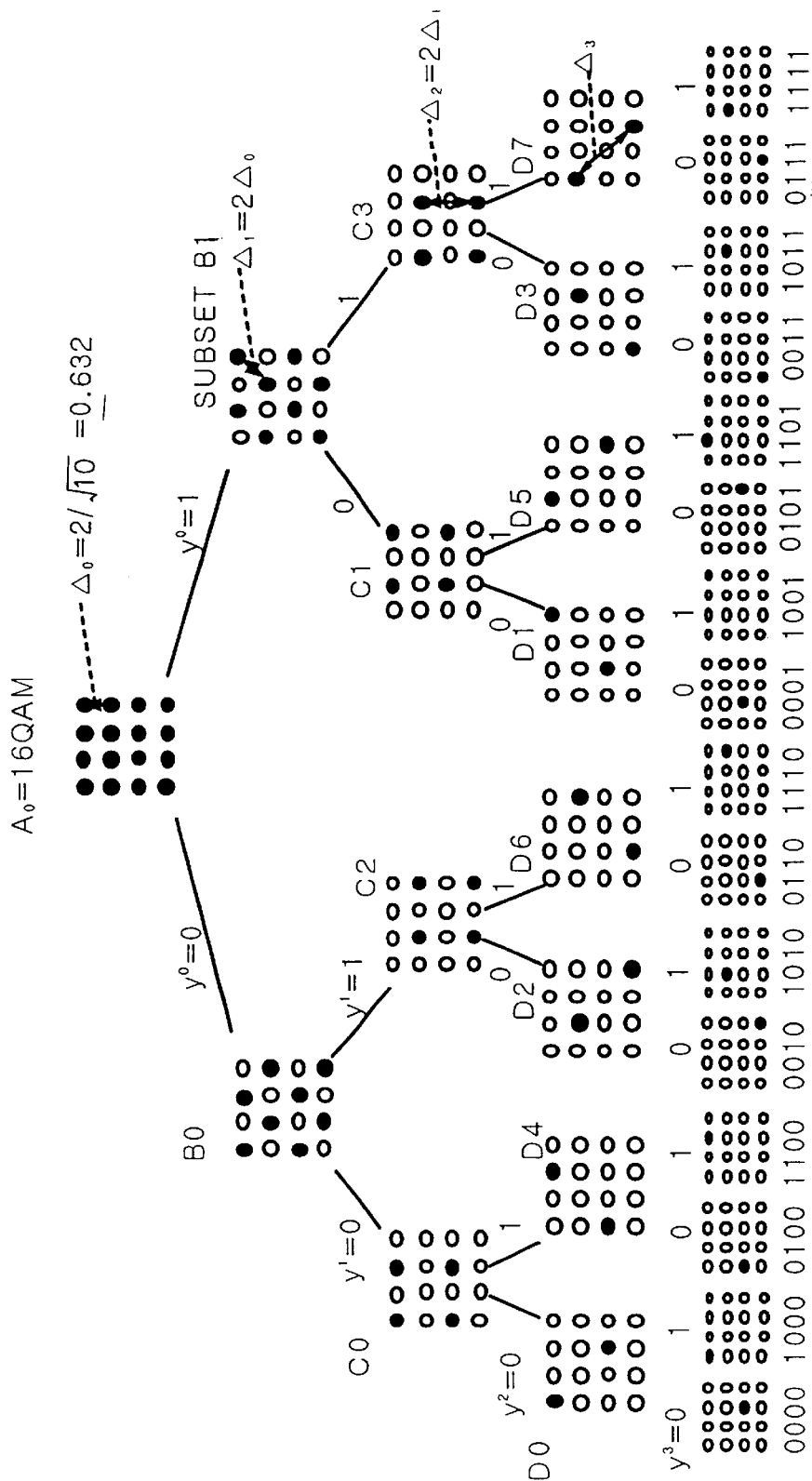
FIG. 2 is a diagram for explaining a set partitioning method for bandwidth-efficient concatenated TCM according to the present invention.

FIG. 2 illustrates a symbol mapping rule referred to by the first and second symbol mappers 14 and 15 of FIG. 1. This rule is the set partitioning method proposed by Ungerboeck. By using this set partitioning method, a detection error can be reduced.

Figure 3:
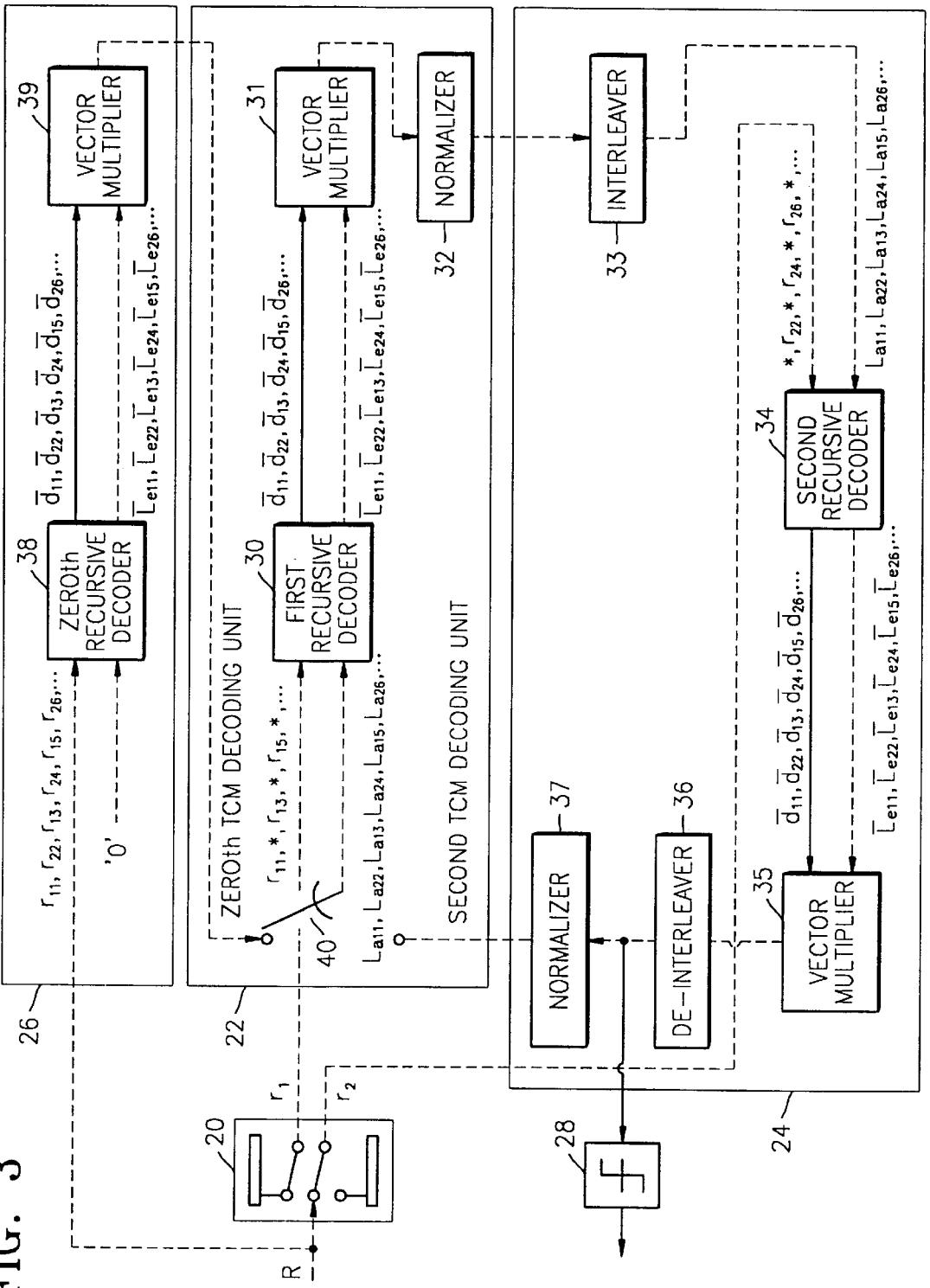
FIG. 3 is a block diagram illustrating the configuration of a bandwidth-efficient concatenated TCM decoder according to an embodiment of the present invention.

An embodiment of a bandwidth-efficient concatenated TCM decoder of FIG. 3 includes a demultiplexer 20 for distributing an output R of a bandwidth-efficient concatenated TCM encoder, which has been distorted during transmission through a channel, to decoders, a zeroth TCM decoding unit 26, a first TCM decoding unit 22, a second TCM decoding unit 24 and a data detector 28. In this embodiment, there is only one second TCM decoding unit 24, but the present invention covers all modifications including more than one second TCM decoding units.

The zeroth TCM decoding unit 26 includes a zeroth recursive decoder 38, preferably a soft-output Viterbi algorithm (SOVA) decoder, and a vector multiplier 39. The first TCM decoding unit 22 includes a first recursive decoder 30, preferably a SOVA decoder, a vector multiplier 31, a normalizer 32 and a switch 40. The second TCM decoding unit 24 includes a pairwise interleaver 33, a second recursive decoder 34, preferably a SOVA decoder, a vector multiplier 35, a pairwise de-interleaver 36 and normalizer 37.

Figure 4:
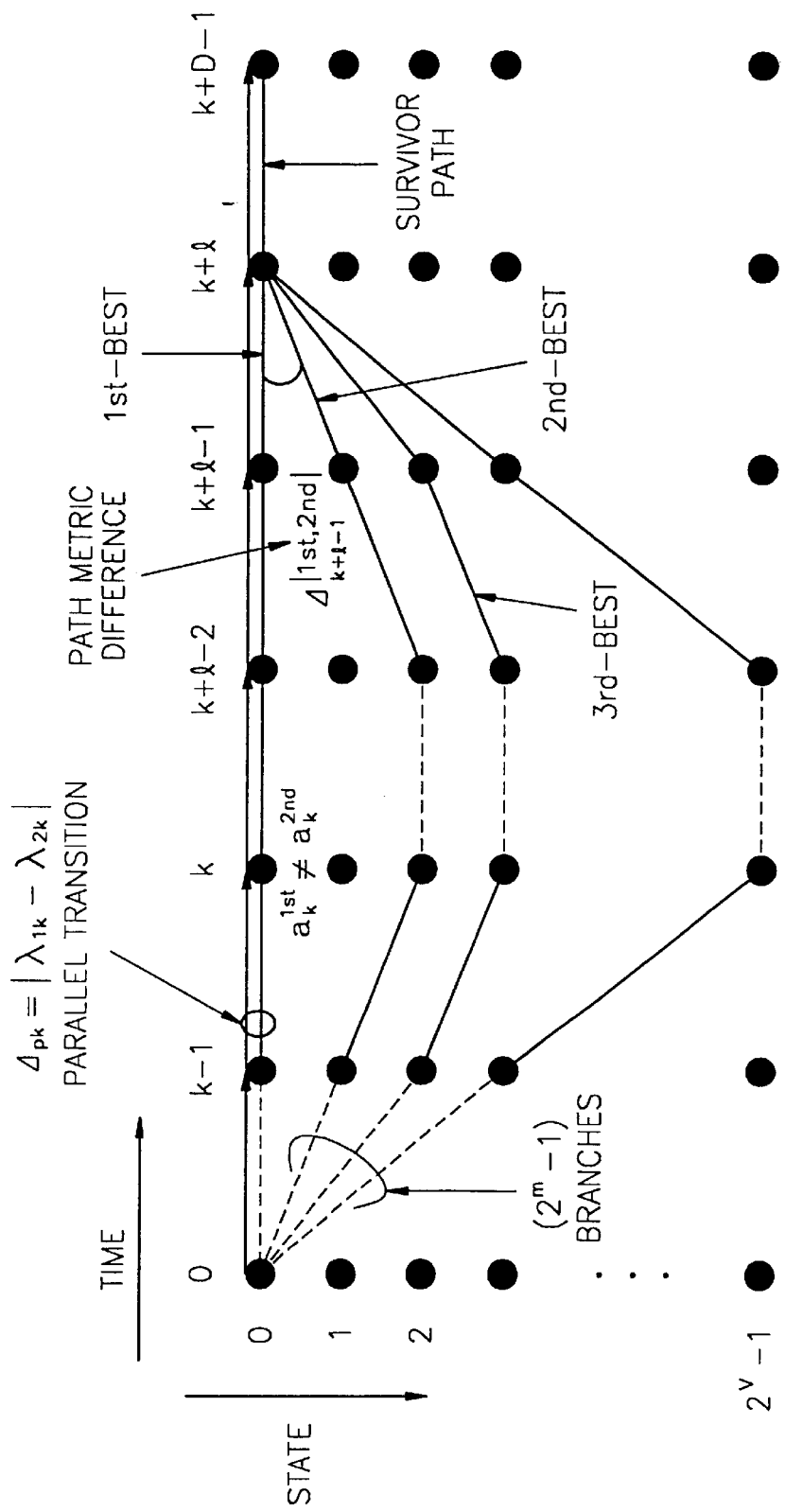
FIG. 4 is a diagram for explaining a procedure of calculating an extrinsic value for a bandwidth-efficient concatenated TCM decoder according to the present invention.

The first recursive decoder 30 and the second recursive decoder 34 receive decoder inputs, respectively, from the demultiplexer 20, decode received symbols into data estimated to be transmitted and output soft-outputs of the data. Here, a method of obtaining a soft-output is illustrated in FIG. 4.

As shown in FIG. 3, each of the recursive decoders 30, 34 and 38 simultaneously outputs a new detection value obtained from input information and an extrinsic value corresponding to the detection value. An extrinsic value indicates a probability that when a decoder decodes input symbols into data estimated to be transmitted from a transmitting party, the data is the same as original data. A TCM decoding unit newly performs decoding using both estimated data and an extrinsic value output from a preceding TCM decoding unit. In other words, the output of a current TCM decoding unit acts as the priori probability of a succeeding TCM decoding unit. The succeeding TCM decoding unit outputs newly calculated detection value and soft-output using the priori probability to another succeeding TCM decoding unit.

There is a step in which the zeroth TCM decoding unit 26 receives total symbols R through a channel before being demultiplexed and calculates an initial soft-output for all the received symbols. This step is for calculating a priori probability to be input to the first TCM decoding unit 22. By adding such a step, the performance of a bandwidth-efficient concatenated TCM decoder according to the present invention can be improved.

The following description concerns the operation of the bandwidth-efficient concatenated TCM decoder of FIG. 3 according to the present invention. Symbols output from a transmitting party have been distorted during transmission through a channel and are received, for example, as a symbol sequence R by the bandwidth-efficient concatenated TCM decoder of FIG. 3. The zeroth recursive decoder 38 outputs an extrinsic value and estimated data of decoded data with respect to the total received symbol sequence R in order to reduce an initial error rate. The vector multiplier 39 multiplies the decoded data by the extrinsic value and outputs the multiplied result to the first recursive decoder 30.

The first recursive decoder 30 outputs new estimated data of decoded data and a new extrinsic value using a priori probability generated by the vector multiplier 39 and a received symbol sequence $r_1$ selected from the received symbol sequence R by the demultiplexer 20. Here, the received symbol sequence $r_1$ corresponds to the output of the basic TCM encoding unit 1 of FIG. 1. The vector multiplier 31 multiplies the decoded data by the extrinsic value. The multiplied result is normalized by the normalizer 32 to prevent overflow.

The normalized value is pairwise interleaved by the interleaver 33, and the interleaved resultant value is input to the second recursive decoder 34. Here, the input value acts as the priori probability of the second recursive decoder 34. The second recursive decoder 34 outputs new estimated data of decoded data and a new extrinsic value using the priori probability and a received symbol sequence $r_2$ selected from the received symbol sequence R by the demultiplexer 20. Here, the received symbol sequence $r_2$ corresponds to the output of the additional TCM encoding unit 2 of FIG. 1. The decoded data and the extrinsic value are multiplied together by the vector multiplier 35, pairwise de-interleaved by the de-interleaver 36 and normalized by the normalizer 37.

The normalized value output from the normalizer 37 is input to the first recursive decoder 30 as priori probability. The first recursive decoder 30 outputs newly estimated data of decoded data and a new extrinsic value using the priori probability and the received symbol sequence $r_1$. The output value is multiplied together by the vector multiplier 31, normalized by the normalizer 32, pairwise interleaved by the interleaver 33 and input to the second recursive decoder 34 as a priori probability. The second recursive decoder 34 outputs newly estimated data of decoded data and a new extrinsic value using the priori probability. The decoded data and extrinsic value are multiplied together by the vector multiplier 35, pairwise de-interleaved by the de-interleaver 36, normalized by the normalizer 37 and input to the first recursive decoder 30 as a priori probability. After this operation is performed a predetermined number of times, the data detector 28 detects data from the output of the de-interleaver 36. The decoded data $\bar{d}$ detected through the above operation is a final decoded output with respect to the data "d" transmitted from the transmitting party.

The above operation will be described in detail with reference to FIG. 3.

It is assumed that predetermined symbols $s_{11}, s_{22}, s_{13}, s_{24}, s_{15}, s_{26}$ output from a transmitting party and distorted during transmission through a channel are received as a symbol sequence $R=(r_{11}, r_{22}, r_{13}, r_{24}, r_{15}, r_{26})$. An extrinsic value is obtained from the symbol sequence R and a priori probability. Here, an initial priori probability is "0". The zeroth recursive decoder 38 outputs decoded data $\overline{d_{11}}, \overline{d_{22}}, \overline{d_{13}}, \overline{d_{24}}, \overline{d_{15}}, \overline{d_{26}}$ and an extrinsic value using the priori probability (its initial value is "0") and the symbol sequence R. A priori probability for the first recursive decoder 30 is obtained using the decoded data and the extrinsic value output from the zeroth recursive decoder 38. In other words, the product of the decoded data and the extrinsic value, $\overline{d_{11}L_{e11}}, \overline{d_{22}L_{e22}}, \overline{d_{13}L_{e13}}, \overline{d_{24}L_{e24}}, \overline{d_{15}L_{e15}}, \overline{d_{26}L_{e26}}$, is input to the first TCM decoding unit 22 and acts as a priori probability.

The first recursive decoder 30 receives the priori probability from the zeroth TCM decoding unit 26 and only symbols that have been encoded and symbol-mapped in the basic TCM encoding unit 1 of FIG. 1, and the performs decoding. In other words, the first recursive decoder 30 outputs newly decoded data and a new extrinsic value based on the priori probability obtained from the vector multiplier 39 and a symbol sequence $r_1$, i.e., $r_{11}$,*,$r_{13}$,*,$r_{15}$,*, demultiplexed from the symbol sequence R. Here, "*" indicates that there is no input. The newly output decoded data and the new extrinsic value output from the first recursive decoder 30 are multiplied together by the vector multiplier 31, normalized by the normalizer 32 and output as a priori probability $\overline{d_{11}L_{e11}}, \overline{d_{22}L_{e22}}, \overline{d_{13}L_{e13}}, \overline{d_{24}L_{e24}}, \overline{d_{15}L_{e15}}, \overline{d_{26}L_{e26}}$ to be used in the second TCM decoding unit 24.

Thus-obtained priori probability is pairwise interleaved by the interleaver 33 and then input to the second recursive decoder 34. The second recursive decoder 34 outputs new decoded data and a new extrinsic value using the input priori probability and symbols demultiplexed from the symbol sequence R, that is, a symbol sequence $r_2$, i.e., *,$r_{22}$,*,$r_{24}$, *,$r_{26}$ resulting from symbols generated through encoding, symbol-mapping and de-interleaving in the additional TCM encoding unit 2 of FIG. 1 and then distorted during transmission through a channel. The decoded data and the extrinsic value output from the second recursive decoder 34 are multiplied together by the vector multiplier 35, thereby generating a value $\overline{d_{11}L_{e11}}, \overline{d_{22}L_{e22}}, \overline{d_{13}L_{e13}}, \overline{d_{24}L_{e24}}, \overline{d_{15}L_{e15}}, \overline{d_{26}L_{e26}}$.

This value is pairwise de-interleaved by the de-interleaver 36 in such a manner corresponding to that of the interleaver 33 and then normalized by the normalizer 36. The normalized value is fed back to the decoder of the first TCM decoding unit 22, i.e., the first recursive decoder 30, as a priori probability. After performing the above operation a predetermined number of times, the bandwidth-efficient concatenated TCM decoder finally detects and outputs decoded data.

FIG. 4 illustrates a procedure of calculating an extrinsic value performed by each of the recursive decoders 30, 34 and 38. In binary turbo TCM, two paths are merged into a single state. In multilevel TCM, a plurality of paths are merged into a single state. Accordingly, an extrinsic value is obtained by a different method in the present invention than in conventional binary turbo TCM. In other words, a path having a large probability among the plurality of paths merged into a given state, that is, a path having a smallest error metric value, becomes a survivor path, and a path having a smallest error metric value among the other paths becomes a competition path. In a multilevel SOVA, paths are updated using a survivor path and a competition path. An extrinsic value of the bits decoded at a predetermined time "k" is determined by the path metric difference between a survivor path and a competition path obtained after a time "D", that is, at a time "k+D". In other words, decoded data is determined using a predetermined decision window, and an extrinsic value is output while the decision window is sliding.

The steps for calculating an extrinsic value will be expressed by formulas below. A method of internally updating a value and a method of transferring an input to a decoder are essential to a decoding method in bandwidth-efficient concatenated TCM modulation. In a bandwidth-efficient concatenated TCM using a SOVA, a soft-output is updated as shown in FIG. 4. FIG. 4 is a trellis diagram illustrating systematic convolution codes having "v" delays and a code rate of m/(m+1). A survivor path is defined 1st-best, the other paths merged into the survivor path are defined 2nd-best, 3rd-best and the like in the decreasing order of path metric. The probability of branch transition is expressed by Equation (1) at a time "j".

$$\gamma(R_j, s_{j-1}^i, s_j^i) = P(R_j | d_j, s_{j-1}^i, s_j^i) P(d_j | s_{j-1}^i, s_j^i) P(s_{j-1}^i | s_j^i) \qquad (1)$$

When considering a parity bit $c_j$, the probability of the branch transition can be expressed by Equation (2).

$$\gamma(R_j, s_{j-1}^i, s_j^i) = \sum_{c_j \in \{0,1\}} P(R_j | d_j, c_j, s_{j-1}^i, s_j^i) P(d_j | s_{j-1}^i, s_j^i) \qquad (2)$$
$$P(c_j | d_j, s_{j-1}^i, s_j^i) P(s_j^i | s_{j-1}^i)$$

In Equation (2), the portion $P(R_j | d_j, c_j, s_{j-1}^i, s_j^i)$ indicates the likelihood of $(d_j, c_j)$ and can be expressed by Equation (3).

$$\gamma(R_j | d_j, c_j, s_{j-1}^i, s_j^i) = K \cdot e^{\frac{|R_j - M(d_j, c_j)|^2}{N_0}} \qquad (3)$$

where K is an integer. In Equation (2), the portion $P(d_j | s_{j-1}^i, s_j^i)$ is determined by available state transition for a single code and becomes "1" or "0". In Equation (2), the portion $P(c_j | d_j, s_{j-1}^i, s_j^i)$ has a value "1" or "0" depending on whether a parity bit considered at a certain time is transmitted from a corresponding TCM encoding unit. When the parity value is not transmitted from the corresponding TCM encoding unit, the portion $P(c_j | d_j, s_{j-1}^i, s_j^i)$ has a value ½ because the parity bit is equally probable and is independent from state transition. The portion $P(s_j^i | s_{j-1}^i)$ of Equation (2) can be expressed by Equation (4).

$$(s_j^i | s_{j-1}^i) = P(d_j = \alpha^q) \qquad (4)$$

In Equation (4), it is assumed that there is no parallel transition, and $\alpha^q$ is an information symbol corresponding to state transition. The value $P(d_j = \alpha^q)$ is calculated using a priori probability obtained from a previous decoding stage. An initial value for every q is set to $P(d_j = \alpha^q) = 2^{-M}$. A branch metric, a path metric and a path probability are calculated. In a $2^m$-ary trellis, $2^m$ trellis branches are converged into a single node. Branches having small probabilities are cut, and a SOVA is applied to the resultant trellis as Equation (4).

When a 3rd-best path metric is much smaller than a 2nd-best path metric, that is, when $P(S_{k+1}^{3rd}, P_{k+1}) \ll P(S_{k+1}^{2nd}, P_{k+1})$, the probability $P_c(S_{k+1}^{1st})$ of correct decision is expressed by Equation (5).

$$P_c(S_{k+1}^{1st}) \approx \frac{P(S_{k+1}^{1st}, R_{k+1})}{P(S_{k+1}^{1st}, R_{k+1}) + P(S_{k+1}^{2nd}, R_{k+1})} \quad (5)$$

$$= \frac{1}{1 + e^{-\Delta_{k+1}^{(1st,2nd)}}}$$

where $\Delta_{k+1}^{(1st,2nd)}$ indicates a metric difference.

Equation (6) expresses the metric difference between a 1st-best path and a 2nd-best path at a time k+1 with respect to a certain node.

$$\Delta_{k+1}^{(1st,2nd)} = \Lambda(S_{k+1}^{1st}) - \Lambda(S_{k+1}^{2nd}) \quad (6)$$

The probability $P_e(S_{k+1}^{1st})$ of incorrect decision is given by Equation (7).

$$P_e(S_{k+1}^{1st}) \approx \frac{P(S_{k+1}^{2nd}, R_{k+1})}{P(S_{k+1}^{1st}, R_{k+1}) + P(S_{k+1}^{2nd}, R_{k+1})} \quad (7)$$

$$= \frac{1}{1 + e^{-\Delta_{k+1}^{(1st,2nd)}}}$$

A posteriori value $L(d_k=\alpha^{1st})$ is a logarithmic value of the ratio of the probability of correct decision to the probability of incorrect decision with respect to an information symbol $\alpha^{1st}$. The posteriori value can be approximated as Equation 8. Here, it can be seen that this is similar to a binary SOVA.

$$L(d_k = a^{1st}) \approx \min_{0 \leq l \leq D} \left\{ \ln \frac{P_c(S_{k+l}^{1st})}{P_e(S_{k+l}^{1st})} \right\} \quad (8)$$

$$= \min_{0 \leq l \leq D} \Delta_{k+l}^{(1st,2nd)}$$

A posteriori value for each of the other symbols is calculated from Equation (9).

$$L(d_k \neq a^{1st}) \approx \max_{0 \leq l \leq D} \left\{ \ln \frac{P_c(S_{k+l}^{1st})}{P_e(S_{k+l}^{1st})} \right\} \quad (9)$$

$$= -\min_{0 \leq l \leq D} \Delta_{k+l}^{(1st,2nd)}$$

Here, the information symbol $\alpha^{1st}$ indicates a path having a smallest error metric among the paths merged into a certain state.

Like a binary SOVA, the extrinsic value of $d_k=\alpha^{1st}$ is calculated from Equation (10).

$$L_e(d_k=\alpha^{1st})=L(d_k=\alpha^{1st})-L_c(d_k=\alpha^{1st})-L_\alpha(d_k=\alpha^{1st}) =L(d_k=\alpha^{1st})- L_c(d_k=\alpha^{1st})-\text{Out}(CMP) \cdot L_\alpha(d_k=\overline{\alpha}^{1st}) \quad (10)$$

where $L_\alpha(d_k=\overline{\alpha}^{1st})=\alpha \cdot L_e(d_k=\overline{\alpha}^{1st})$, $L_\alpha(d_k\overline{\alpha}^{1st})$ is an extrinsic value obtained in a previous decoding stage, Out(CMP) is a function which outputs +1 if $\alpha^s=\overline{\alpha}^s$ and −1 otherwise, and $\alpha$ is a scaling coefficient which is a constant for scaling down the extrinsic value.

The priori value $$P(d_k = a^{-q})$$

can be approximated as Equation (11).

$$P(d_k = a^{-q}) = \begin{cases} 1/(1 + \exp\{-L_a(d_k = a^{-1st})\}) & \text{if } a^q = a^{-1st} \\ 1/(1 + \exp\{L_a(d_k = a^{-1st})\}) & \text{otherwise} \end{cases} \quad (11)$$

Equation (9) represents that the probabilities of all paths other than the 1st-best one are the same. Equation (11) represents that the priori probabilities of all information symbols other than $d_k=\alpha^{1st}$ are the same. A receiving party cannot calculate the likelihood of only information symbols because a parity bit and an information symbol are combined into a channel symbol, and the channel symbol is transmitted in TCM. Accordingly, the likelihood of information symbols is calculated from the average probability of parity bits under the assumption that the parity bits generated have the same probability, as expressed by Equation (12).

$$(R_k|d_k = a^q) = \frac{1}{2} \sum_{c_k \in \{0,1\}} P(R_k|d_k = a^q, c_k) \quad (12)$$

According to the present invention, turbo codes are applied to TCM having a code rate of m/(m+1) to compensate for the drawbacks of conventional TCM and turbo codes, thereby enhancing the steadiness against ISI and improving power and bandwidth efficiency.

Bandwidth-efficient concatenated TCM according to the present invention is a channel coding method suitable far high speed wireless communication. TCM is combined with turbo codes to increase spectral efficiency. The present invention can be applied to a multilevel modulation system having high bandwidth efficiency.

A bandwidth-efficient concatenated TCM decoding method according to the present invention uses a SOVA algorithm, thereby reducing decoder complexity and path memory.

In addition, the present invention realizes bandwidth-efficient concatenated TCM encoder and decoder such to have parallel transition, thereby reducing the complexity of the bandwidth-efficient concatenated TCM decoder.

Therefore, the present invention is applied to a high speed wireless communication system and can increase bandwidth efficiency and coding gain.

What is claimed is:

1. A bandwidth-efficient concatenated trellis-coded modulation (TCM) decoder comprising:
   a demultiplexer for distributing a predetermined number of symbols that have been encoded by a bandwidth-efficient concatenated TCM encoder and received through a channel;
   first through N-th TCM decoding units (N is an integer of 2 or larger) for each receiving a current priori probability and symbols distributed by the demultiplexer, generating a detection value and an extrinsic value of the detection value and multiplying the detection value by the extrinsic value to generate a new priori probability; and
   a data detector for detecting final data from an output of the N-th TCM decoding unit after the operation performed by the first through N-th TCM decoding units is repeated a predetermined number of times,
   wherein the first through N-th TCM decoding units are connected in the form of a loop, and each of them generates the new priori probability and transfers it to a next TCM decoding unit as the current priori probability of the next TCM decoding unit.

2. The bandwidth-efficient concatenated trellis-coded modulation (TCM) decoder of claim 1, wherein the first TCM decoding unit comprises:

a basic recursive decoder for receiving the current priori probability and the symbols distributed by the demultiplexer for the first TCM decoding unit and for generating the detection value and the extrinsic value of the detection value of the first TCM decoding unit; and a basic vector multiplier for multiplying the detection value and the extrinsic value of the detection value of the first TCM decoding unit to generate the new priori probability of the first TCM decoding unit, and each of the second through N-th TCM decoding units comprises:

a pairwise interleaver for pairwise interleaving the current priori probability for the respective second through N-th TCM decoding unit in a predetermined manner;

an additional recursive decoder for receiving the symbols distributed by the demultiplexer for the respective second through N-th TCM decoding unit and the pairwise interleaved current priori probability and for generating the detection value and the extrinsic value of the detection value of the respective second through N-th TCM decoding unit;

an additional vector multiplier for multiplying the detection value and the extrinsic value of the detection value of the respective second through N-th TCM decoding unit to generate a pairwise interleaved new priori probability; and a pairwise de-interleaver for pairwise de-interleaving the pairwise interleaved new priori probability in a manner corresponding to the predetermined manner to generate the new priori probability of the respective second through N-th TCM decoding unit.

3. The bandwidth-efficient concatenated trellis-coded modulation (TOM) decoder of claim 2, wherein each of the first through N-th TCM decoding units further comprises a normalizer for normalizing the respective new priori probability to prevent overflow.

4. The bandwidth-efficient concatenated trellis-coded modulation (TCM) decoder of claim 2, wherein each of the basic recursive decoder of the first TCM decoding unit and the additional recursive decoders of the second through N-th TCM decoding units uses a soft-output Viterbi algorithm.

5. The bandwidth-efficient concatenated trellis-coded modulation (TCM) decoder of claim 2, wherein each of the basic recursive decoder of the first TCM decoding unit and the additional recursive decoders of the second through N-th TCM decoding units obtains the extrinsic value using the difference between the error metric of a survivor path and the error metric of a competition path when among branches merged to a certain state, a path having a smallest error metric is defined as the survivor path, and a path having a second smallest error metric is defined as the competition path.

6. The bandwidth-efficient concatenated trellis-coded modulation (TCM) decoder of claim 5, wherein the received symbols are a hexadecimal or larger symbols, each of the basic recursive decoder of the first TCM decoding unit and the additional recursive decoders of the second through N-th TCM decoding units performs decoding using parallel transition, and the difference between two parallel transitions at a certain time is set as an extrinsic value.

7. The bandwidth-efficient concatenated trellis-coded modulation (TCM) decoder of claim 1, further comprising a zeroth decoding unit for receiving all the predetermined number of symbols from the demultiplexer, generating an initial priori probability, and providing the initial priori probability to the first decoding unit in order to reduce an initial decoding error.

8. A bandwidth-efficient concatenated trellis-coded modulation (TCM) decoding method comprising the steps of:

(a) generating an initial priori probability from a predetermined number of received symbols;

(b) using some of the predetermined number of symbols received and the initial priori probability to generate a detection value and an extrinsic value of the detection value and multiplying the detection value by the extrinsic value of the detection value to generate a new priori probability;

(c) setting the new priori probability as a current priori probability and pairwise interleaving the current priori probability in a predetermined manner; using some of the predetermined number of symbols received and the pairwise interleaved current priori probability to generate another detection value and an extrinsic value of the another detection value; multiplying the another detection value by the extrinsic value of the another detection value and pairwise de-interleaving the product to generate another new priori probability; and d) replacing the initial priori probability in the step (b) with the another new priori probability generated in the step (c) and repeating the steps (b) and (c) a predetermined number of times and then detecting final data.

9. The bandwidth-efficient concatenated trellis-coded modulation (TCM) decoding method of claim 8, comprising:

normalizing the new priori probability generated in step (b) prior to setting the new priori probability as the current priori probability in step (c); and normalizing the another new priori probability generated in step (C) prior to replacing the initial priori probability with the another new priori probability in step (d).

* * * * *